(12) United States Patent
Chen et al.

(10) Patent No.: US 12,490,509 B2
(45) Date of Patent: Dec. 2, 2025

(54) METHOD OF MANUFACTURING SEMICONDUCTOR DEVICES AND A SEMICONDUCTOR DEVICE

(71) Applicant: Taiwan Semiconductor Manufacturing Company, Ltd., Hsinchu (TW)

(72) Inventors: Chun-Hung Chen, Hsinchu (TW); Chih-Hung Hsieh, Hsinchu (TW); Jhon Jhy Liaw, Zhudong Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 24 days.

(21) Appl. No.: 18/411,861

(22) Filed: Jan. 12, 2024

(65) Prior Publication Data
US 2024/0153953 A1    May 9, 2024

Related U.S. Application Data

(60) Continuation of application No. 17/516,110, filed on Nov. 1, 2021, now Pat. No. 11,908,864, which is a division of application No. 16/019,420, filed on Jun. 26, 2018, now Pat. No. 11,164,746.

(51) Int. Cl.
*H10D 84/85*     (2025.01)
*H01L 21/265*    (2006.01)
*H01L 21/266*    (2006.01)

(52) U.S. Cl.
CPC ..... *H10D 84/853* (2025.01); *H01L 21/26513* (2013.01); *H01L 21/26533* (2013.01); *H01L 21/26586* (2013.01); *H01L 21/266* (2013.01); *H10D 84/854* (2025.01); *H10D 84/859* (2025.01)

(58) Field of Classification Search
CPC ........ H01L 21/26533; H01L 21/26586; H10D 84/853; H10D 84/854; H10D 84/859
See application file for complete search history.

(56) References Cited

U.S. PATENT DOCUMENTS

| | | | |
|---|---|---|---|
| 4,259,681 A | 3/1981 | Nishizawa |
| 4,728,619 A | 3/1988 | Pfiester et al. |
| 5,455,437 A | 10/1995 | Komori et al. |
| 5,770,504 A | 6/1998 | Brown et al. |

(Continued)

FOREIGN PATENT DOCUMENTS

| | | |
|---|---|---|
| CN | 103594516 A | 2/2014 |
| CN | 106206438 A | 12/2016 |

(Continued)

OTHER PUBLICATIONS

Matino, H. et al., "Structure to Prevent Latch-Up of CMOS Devices," IBM Technical Disclosure Bulletin, vol. TDB 08-86, p. 4277; originally published Mar. 1, 1986.

(Continued)

*Primary Examiner* — Peter M Albrecht
(74) *Attorney, Agent, or Firm* — HAYNES AND BOONE, LLP

(57) ABSTRACT

In a method of manufacturing a semiconductor device, a first-conductivity type implantation region is formed in a semiconductor substrate, and a carbon implantation region is formed at a side boundary region of the first-conductivity type implantation region.

20 Claims, 15 Drawing Sheets

(56) References Cited

U.S. PATENT DOCUMENTS

| | | |
|---|---|---|
| 6,010,926 A | 1/2000 | Rho et al. |
| 6,514,833 B1 | 2/2003 | Ishida et al. |
| 8,211,784 B2 | 7/2012 | Hong et al. |
| 9,070,744 B2 | 6/2015 | Yan |
| 9,899,273 B1 | 2/2018 | Wang et al. |
| 10,546,937 B2 | 1/2020 | Singh et al. |
| 2004/0219769 A1 | 11/2004 | Voldman et al. |
| 2007/0164375 A1 | 7/2007 | Ohta et al. |
| 2008/0210980 A1 | 9/2008 | Disney et al. |
| 2009/0206445 A1 | 8/2009 | Fujimoto et al. |
| 2011/0095339 A1 | 4/2011 | Hong et al. |
| 2014/0248756 A1 | 9/2014 | Lee |
| 2015/0126008 A1 | 5/2015 | Paul et al. |
| 2016/0049402 A1 | 2/2016 | Liu et al. |
| 2016/0204039 A1 | 7/2016 | Togo |
| 2017/0200721 A1 | 7/2017 | Chen et al. |
| 2018/0130802 A1 | 5/2018 | Wang et al. |

FOREIGN PATENT DOCUMENTS

| | | |
|---|---|---|
| DE | 10 2013 108 707 A1 | 2/2014 |
| JP | 2006-313922 A | 11/2006 |
| JP | 2013-034029 A | 2/2013 |
| KR | 10-0228331 B1 | 11/1999 |
| KR | 10-2014-0108952 A | 9/2014 |
| TW | 578210 B | 3/2004 |
| TW | 200936825 A | 9/2009 |

OTHER PUBLICATIONS

Non-Final Office Action issued in U.S. Appl. No. 16/019,420, dated May 1, 2019.

Final Office Action issued in U.S. Appl. No. 16/019,420, dated Sep. 18, 2019.

Non-Final Office Action issued in U.S. Appl. No. 16/019,420, dated Jun. 25, 2020.

Final Office Action issued in U.S. Appl. No. 16/019,420, dated Nov. 20, 2020.

Notice of Allowance issued in U.S. Appl. No. 16/019,420, dated Jun. 30, 2021.

Non-Final Rejection issued in U.S. Appl. No. 17/516,110, dated Jun. 16, 2023.

Notice of Allowance issued in U.S. Appl. No. 17/516,110, dated Oct. 17, 2023.

METHOD OF MANUFACTURING SEMICONDUCTOR DEVICES AND A SEMICONDUCTOR DEVICE

RELATED APPLICATIONS

This application is a continuation of U.S. patent application Ser. No. 17/516,110, filed Nov. 1, 2021, which is a division of U.S. patent application Ser. No. 16/019,420, filed Jun. 26, 2018, now U.S. Pat. No. 11,164,746, the entire content of each of which are incorporated herein by reference.

TECHNICAL FIELD

The disclosure relates to methods of manufacturing semiconductor integrated circuits, and more particularly to a method of manufacturing semiconductor devices including complementary metal-oxide-semiconductor field effect transistors (CMOS FETs).

BACKGROUND

CMOS FETs have been utilized for their low power consumption. In CMOS FETs, however, preventing latch-up has been one of the issues in device and process technologies. With increasing down-scaling of integrated circuits and increasingly demanding requirements of speed of integrated circuits, more effective measures to prevent latch up are required.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanying drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in between the described operations, and the order of operations may be changed. In the present disclosure, the phrase "at least one of A, B and C" means either one of A, B, C, A+B, A+C, B+C or A+B+C, and does not mean one from A, one from B and one from C, unless otherwise explained.

Disclosed embodiments relate to a semiconductor device, in particular, a CMOS FET, for example, a fin field effect transistor (FinFET) and its manufacturing method. The embodiments such as those disclosed herein are generally applicable not only to FinFETs but also to a planar FET, a double-gate FET, a surround-gate FET, an omega-gate FET or gate-all-around (GAA) FET, and/or a nanowire FET, or any suitable device having a three-dimensional channel structure.

Figure 1A:
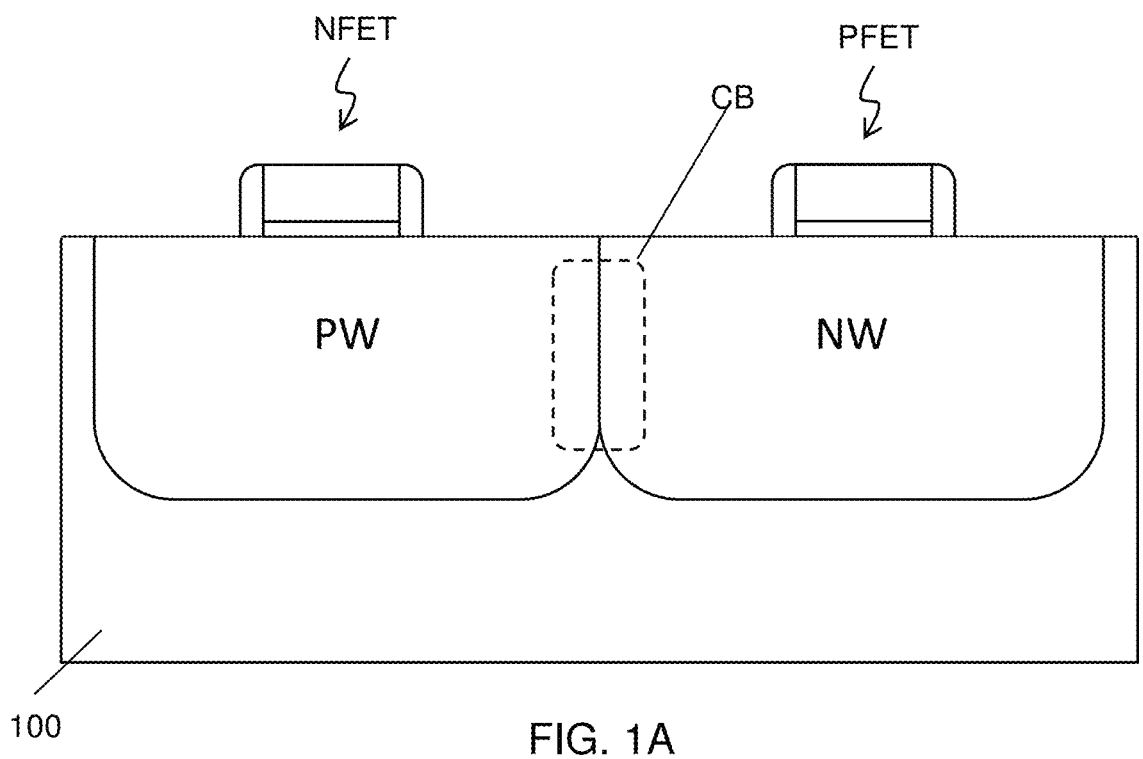
FIG. 1A illustrates a cross sectional view of a semiconductor device in accordance with an embodiment of the present disclosure.

FIG. 1A shows a cross sectional view of a semiconductor device in accordance with an embodiment of the present disclosure. As shown in FIG. 1A, a p-type well PW and an n-type well NW are formed in a semiconductor substrate 100. The p-type well PW contains p-type impurities, such as boron, and the n-type well NW contains n-type impurities, such as phosphorous and arsenic. An n-type FET NFET is disposed over the p-type well PW and a p-type FET PFET is disposed over the n-type well NW. The p-type and n-type FETs can be any FET, for example, a planar type FET, a FinFET and a GAA FET. The substrate 100 may be a p-type substrate or an n-type semiconductor substrate. In some embodiments, the substrate 100 may be made of a suitable elemental semiconductor, such as silicon, diamond or germanium; a suitable alloy or compound semiconductor, such as Group-IV compound semiconductors (silicon germanium (SiGe), silicon carbide (SiC), silicon germanium carbide (SiGeC), GeSn, SiSn, SiGeSn), Group III-V compound semiconductors (e.g., gallium arsenide (GaAs), indium gallium arsenide (InGaAs), indium arsenide (InAs), indium phosphide (InP), indium antimonide (InSb), gallium arsenic phosphide (GaAsP), or gallium indium phosphide (GaInP)), or the like. Further, the substrate 100 may include an epitaxial layer (epi-layer), which may be strained for performance enhancement, and/or may include a silicon-on-insulator (SOI) structure. In one embodiment, a p-type silicon substrate is used.

As shown in FIG. 1A, in the present embodiments, a carbon barrier region CB, which is formed by implanting carbon therein, is formed at or around the boundary region of the p-type well PW and the n-type well NW. The carbon barrier region can prevent a leakage current at a PN junction formed by the p-type well and the n-type well, and thus can prevent latch up.

Figure 1B:
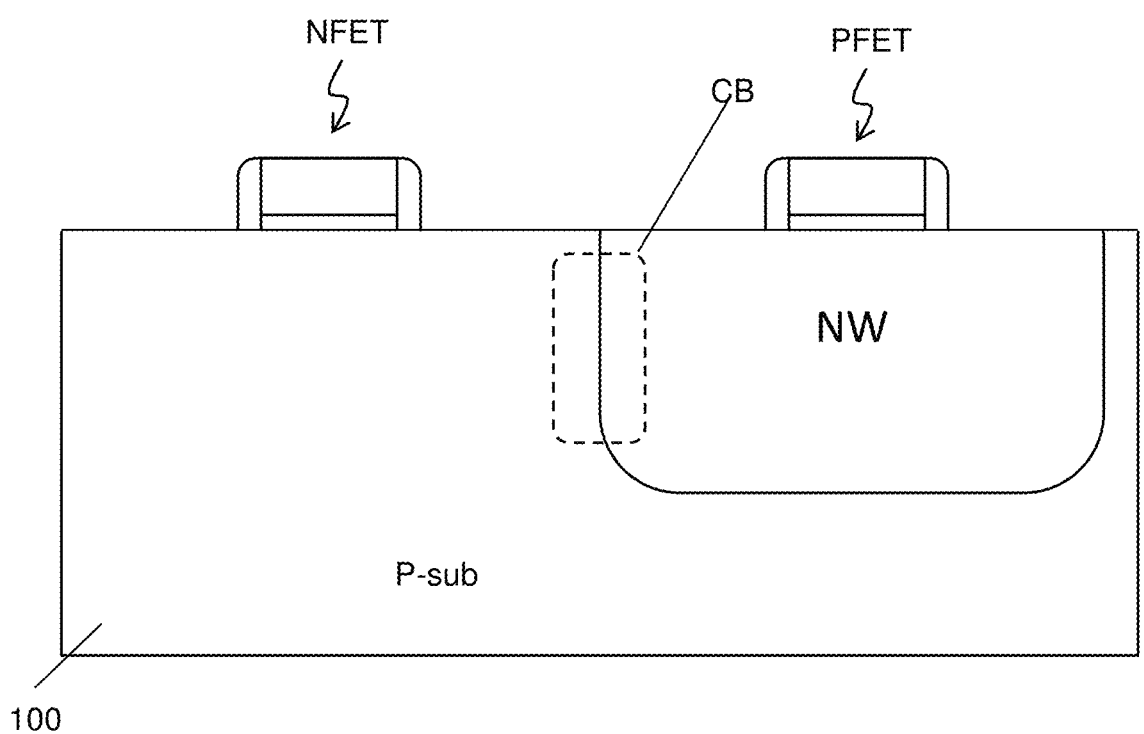
FIG. 1B illustrates a cross sectional view of a semiconductor device in accordance with another embodiment of the present disclosure.

FIG. 1B shows a cross sectional view of a semiconductor device in accordance with another embodiment of the present disclosure. In this embodiment, the substrate 100 is a p-type substrate and an n-type well NW is formed. The carbon barrier region CB is formed at or around the vertical interface between the n-type well NW and the substrate 100. Similar to FIG. 1A, the carbon barrier region CB can prevent a leakage current at a PN junction formed by the p-type substrate and the n-type well, and thus can prevent latch up.

FIGS. 2-12 show cross sectional views of a sequential manufacturing operation for a semiconductor device in accordance with an embodiment of the present disclosure. It is understood that additional operations can be provided before, during, and after processes shown by FIGS. 2-12, and some of the operations described below can be replaced or eliminated, for additional embodiments of the method. The order of the operations/processes may be interchangeable. FIGS. 2-12 correspond to line X1-X1 of FIG. 13, which is a plan view of static random access memory cells.

Figure 2:
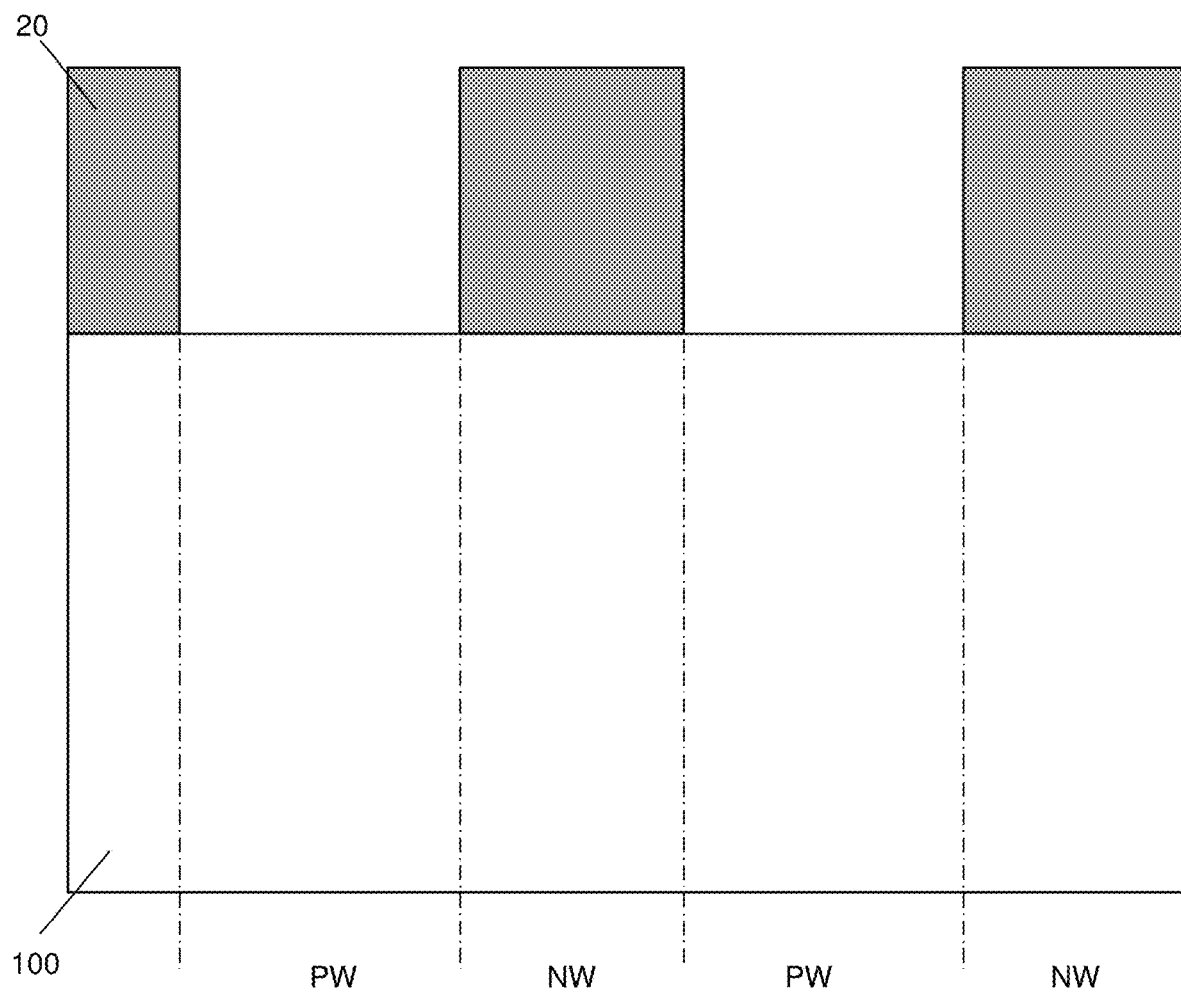
FIG. 2 illustrates one of the various stages of a semiconductor device fabrication process in accordance with an embodiment of the present disclosure.

A as shown in FIG. 2, a first mask pattern 20 is formed over a substrate 100. The first mask pattern 20 is, for example, a photo resist pattern formed by one or more lithography operations. The first mask pattern 20 covers areas in which n-type wells NW are subsequently formed and has openings under which p-type wells PW are subsequently formed.

Figure 3:
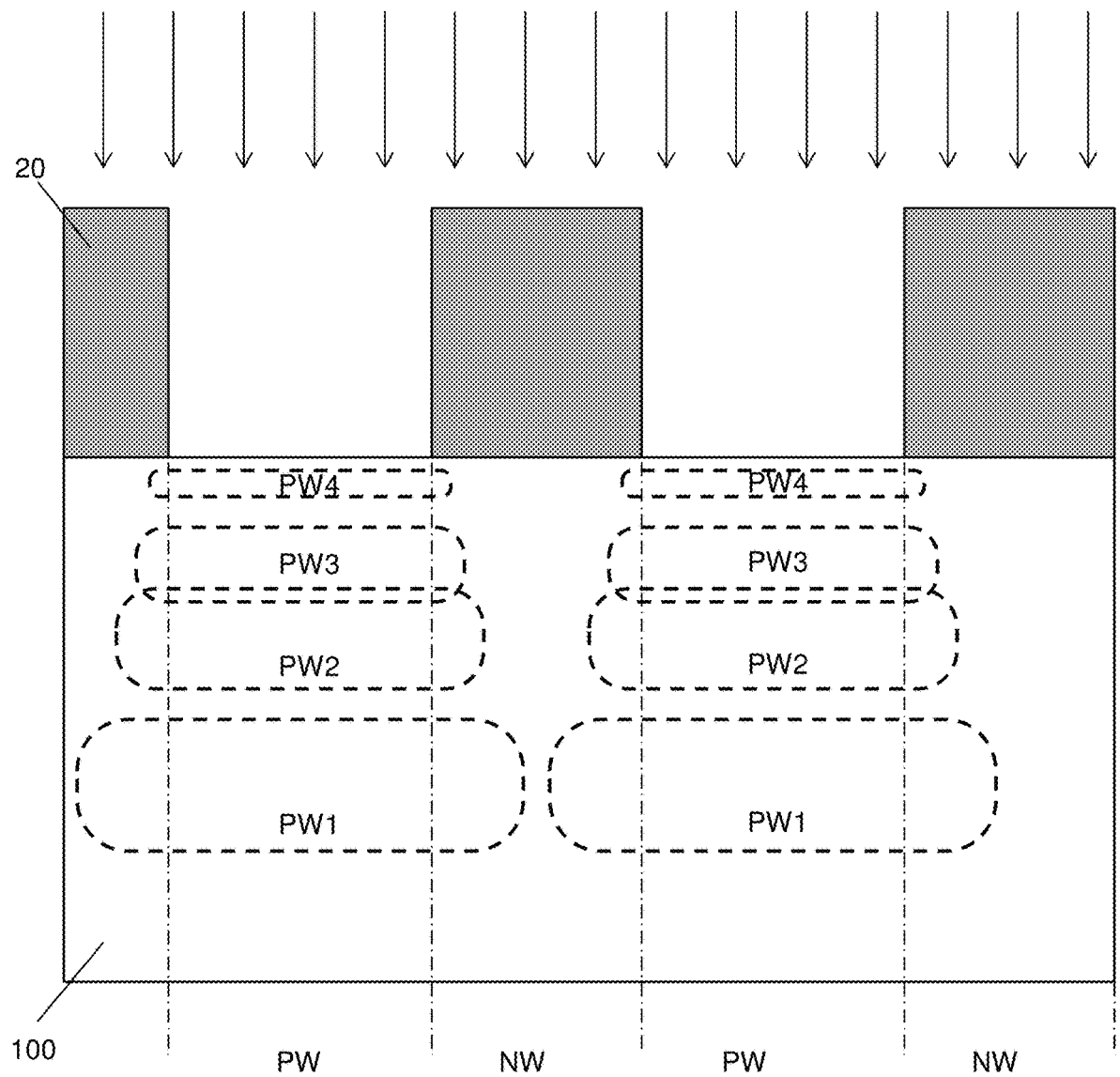
FIG. 3 illustrates one of the various stages of a semiconductor device fabrication process in accordance with an embodiment of the present disclosure.

Then, as shown in FIG. 3, one or more ion implantation processes 22 are performed to introduce p-type impurities in the substrate 100. In some embodiments, three ion implantation processes are performed to form a deep p-type implantation region PW1, a middle p-type implantation region PW2 above the deep p-type implantation region PW1 and a shallow p-type implantation region PW3 above the middle p-type implantation region PW2. In addition, in some embodiments, a p-type anti-punch-through implantation region PW4 is formed above the shallow p-type implantation region PW3 by an additional ion implantation process.

In some embodiments, the deep p-type implantation region PW1 is formed by implanting boron ($BF_2$) at an acceleration energy in a range from about 30 keV to about 70 KeV, and in a range from about 40 keV to about 60 keV in other embodiments. The center of the deep p-type implantation region PW1 is located at about 130 nm to about 220 nm deep from the surface of the substrate 100. The dose amount for the deep p-type implantation region PW1 is in a range from about range from $1 \times 10^{13}$ ions·cm$^{-2}$ to about $5 \times 10^{13}$ ions·cm$^{-2}$ and is in a range from about range from $2 \times 10^{13}$ ions·cm$^{-2}$ to $4 \times 10^{13}$ ions·cm$^{-2}$ in other embodiments.

In some embodiments, the middle p-type implantation region PW2 is formed by implanting boron ($BF_2$) at an acceleration energy in a range from about 15 keV to about 40 KeV, and in a range from about 20 keV to about 35 keV in other embodiments. The center of the middle p-type implantation region PW2 is located at about 70 nm to about 140 nm deep from the surface of the substrate 100. The dose amount for the middle p-type implantation region PW2 is in a range from about range from $5 \times 10^{12}$ ions·cm$^{-2}$ to about $5 \times 10^{13}$ ions·cm$^{-2}$ and is in a range from about range from $1 \times 10^{13}$ ions·cm$^{-2}$ to $3 \times 10^{13}$ ions·cm$^{-2}$ in other embodiments. In some embodiments, the dose amount for the middle p-type implantation region PW2 is smaller than the dose amount for the deep p-type implantation region PW1.

In some embodiments, the shallow p-type implantation region PW3 is formed by implanting boron ($BF_2$) at an acceleration energy in a range from about 5 keV to about 25 KeV, and in a range from about 10 keV to about 20 keV in other embodiments. The center of the shallow p-type implantation region PW3 is located at about 35 nm to about 85 nm deep from the surface of the substrate 100. The dose amount for the shallow p-type implantation region PW3 is in a range from about range from $1 \times 10^{13}$ ions·cm$^{-2}$ to about $5 \times 10^{13}$ ions·cm$^{-2}$ and is in a range from about range from $2 \times 10^{13}$ ions·cm$^{-2}$ to $4 \times 10^{13}$ ions·cm$^{-2}$ in other embodiments. In some embodiments, the dose amount for the shallow p-type implantation region PW3 is larger than the dose amount for the middle p-type implantation region PW2.

In some embodiments, the anti-punch-through implantation region PW4 is formed by implanting boron ($BF_2$) at an acceleration energy in a range from about 1 keV to about 10 KeV, and in a range from about 2 keV to about 8 keV in other embodiments. The center of the anti-punch-through implantation region PW4 is located at about 8 nm to about 35 nm deep from the surface of the substrate 100. The dose amount for the anti-punch-through implantation region PW4 is in a range from about range from $2 \times 10^{13}$ ions·cm$^{-2}$ to about $2 \times 10^{14}$ ions·cm$^{-2}$ and is in a range from about range from $5 \times 10^{13}$ ions·cm$^{-2}$ to $1 \times 10^{14}$ ions·cm$^{-2}$ in other embodiments. In some embodiments, the dose amount for the anti-punch-through implantation region PW4 is larger than the dose amounts for the deep, middle and shallow p-type implantation regions.

The ions for the implantations regions PW1, PW2, PW3 and/or PW4 are implanted along the normal direction of the substrate 100 in some embodiments, and in other embodiments, the implanting direction of the ions is tilted from the normal direction at about 7-8 degrees to avoid channeling effects. If the implanting direction is tilted, two or four implantation operations may be performed with rotating the substrate by 180 degrees or 90 degrees within its surface plane. As shown in FIG. 3, due to scattering by lattice of the substrate 100, the implanted regions extend below the first mask pattern 20. The deeper the implanted region is, the greater the amount of extension becomes.

Figure 4:
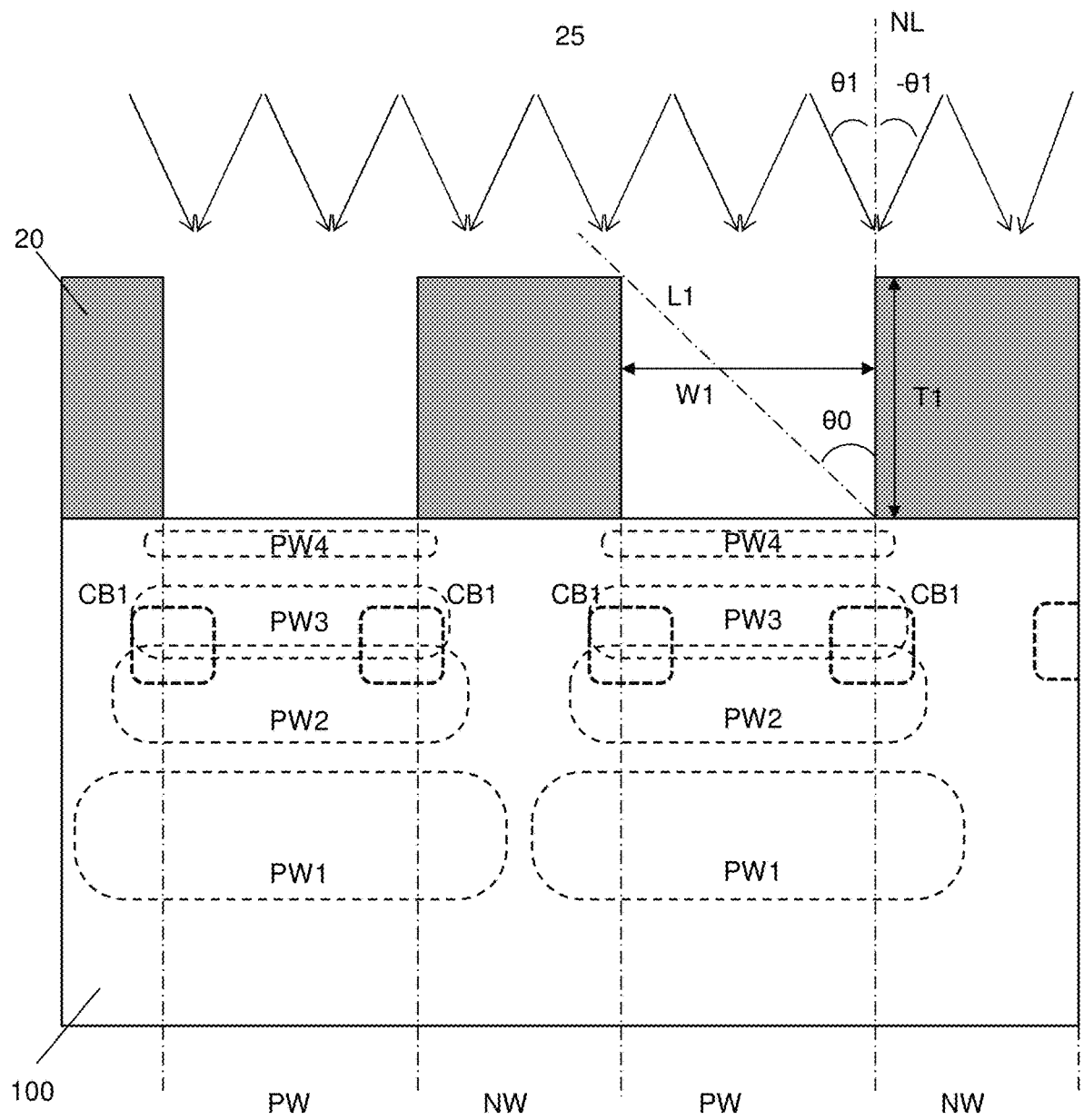
FIG. 4 illustrates one of the various stages of a semiconductor device fabrication process in accordance with an embodiment of the present disclosure.

Then, as shown in FIG. 4, carbon ions 25 are implanted into the substrate 100. In some embodiments, the same first mask pattern 20 is used for the carbon implantation. In some embodiments, the implantation direction of the carbon ions is tilted by $\theta 1$ degrees and $-\theta 1$ degrees with respect to the normal line NL of the substrate 100. In other words, the carbon implantation operation includes a first implantation operation with the tilt angle $\theta 1$ degrees and a second implantation operation with the tilt angle $-\theta 1$ degrees. The second implantation operation with the tilt angle $-\theta 1$ degrees can be performed by rotating the substrate 100 within its surface plane.

In some embodiments, the tilt angle $\theta 1$ is in a range from about 5 degrees to about 18 degrees, and is in a range from about 7 degrees to about 15 degrees in other embodiments. In some embodiments, the tilt angle $\theta 1$ is equal to or greater than an angle $\theta 0$, which is an angle between the normal direction NL and line L1 shown in FIG. 4 and is defined by the width W1 of the mask opening and the thickness T1 of the first mask pattern 20. In some embodiments, the width W1 is in a range from about 50 nm to about 200 nm and the thickness T1 is in a range from about 400 nm to about 600 nm. As shown in FIG. 4, the first carbon implanted regions CB1 are formed below the edges of the first mask pattern 20.

In some embodiments, the first carbon implantation region CB1 is formed by implanting carbon at acceleration energy in a range from about 10 keV to about 60 KeV, and in a range from about 5 keV to about 50 keV in other embodiments. The center of the first carbon implantation region CB1 is located at about 45 nm to about 165 nm deep from the surface of the substrate 100. As shown in FIG. 4, in some embodiments, the first carbon implantation region CB1 is located between the middle and shallow p-type implantation regions PW2 and PW3. The dose amount for the first carbon implantation region CB1 is in a range from about range from $1 \times 10^{13}$ ions·cm$^{-2}$ to about $2 \times 10^{14}$ ions·cm$^{-2}$ and is in a range from about range from $3 \times 10^{13}$ ions·cm$^{-2}$ to $1 \times 10^{14}$ ions·cm$^{-2}$ in other embodiments. The carbon ion implantation can be performed before the implantation processes for the p-type implantation regions PW1-PW4, in some embodiments. Subsequently, the first mask pattern 20 is removed. The doping concentration of the carbon implantation region CB1 is in a range from about $1 \times 10^{18}$ atoms·cm$^{-3}$ to about $2 \times 10^{19}$ atoms·cm$^{-3}$ in some embodiments.

Figure 5:
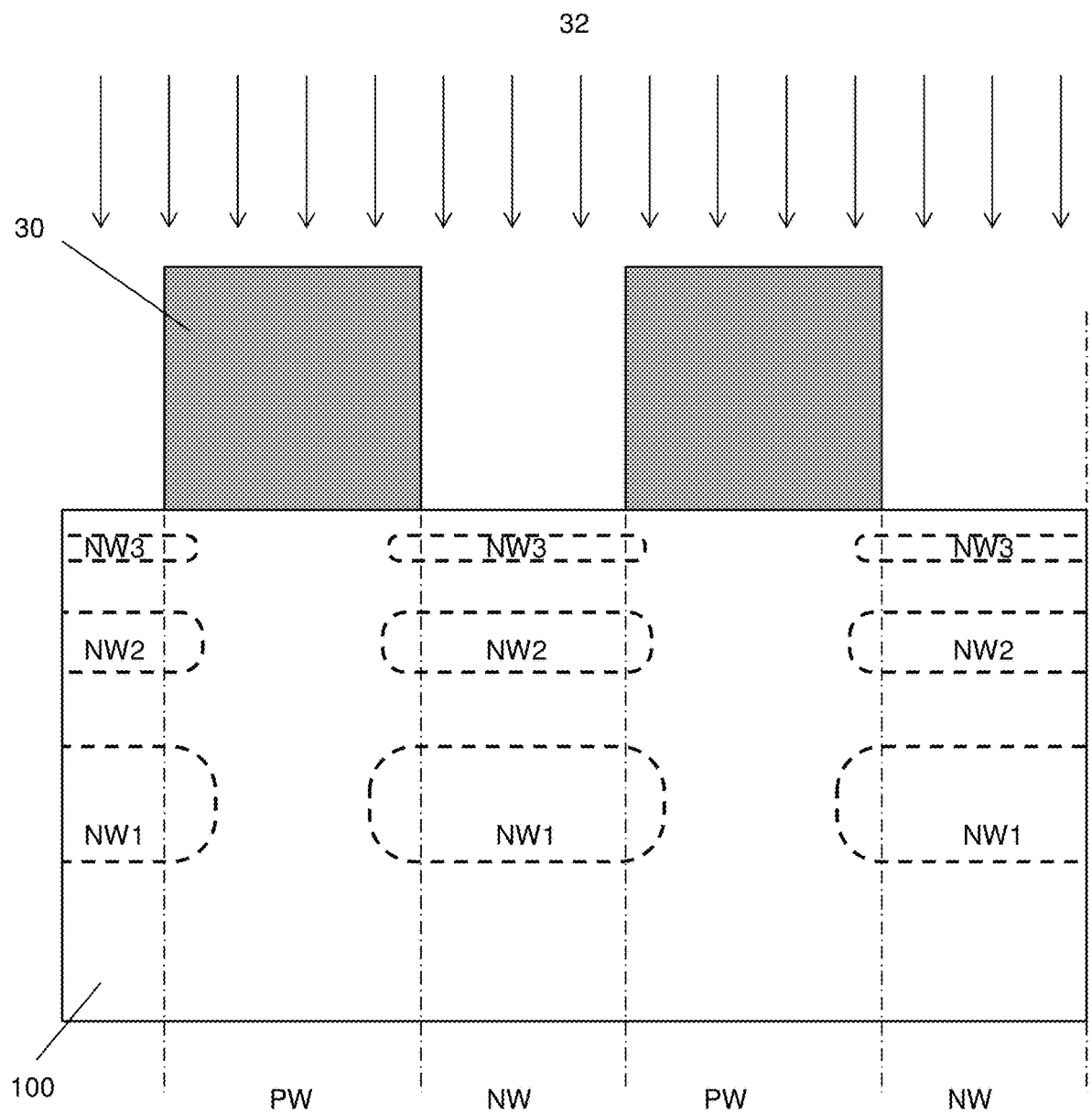
FIG. 5 illustrates one of the various stages of a semiconductor device fabrication process in accordance with an embodiment of the present disclosure.
Figure 6:
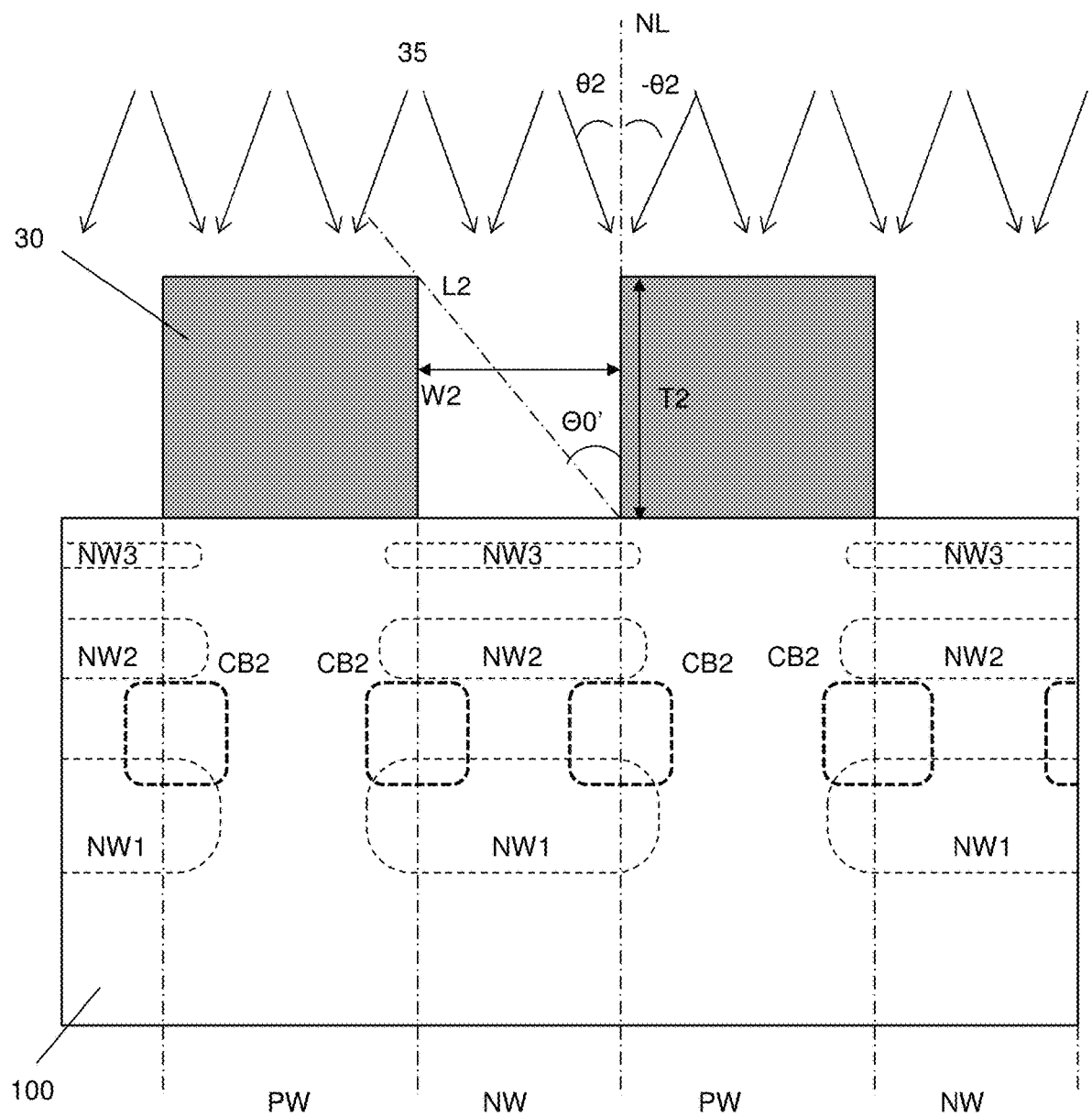
FIG. 6 illustrates one of the various stages of a semiconductor device fabrication process in accordance with an embodiment of the present disclosure.

Then, as shown in FIG. 5, a second mask pattern 30 is formed over the substrate 100. In FIGS. 5 and 6, the p-type implantation regions and the carbon implantation regions are not shown for simplicity. The second mask pattern 30 is, for example, a photo resist pattern formed by one or more lithography operations. The second mask pattern 30 covers areas in which p-type wells PW are formed and has openings under which n-type wells NW are subsequently formed. As shown in FIG. 5, one or more ion implantation processes 32 are performed to introduce n-type impurities in the substrate 100. In some embodiments, two ion implantation processes are performed to form a deep n-type implantation region NW1 and a shallow n-type implantation region NW2 above the deep n-type implantation region NW1. In addition, in some embodiments, an n-type anti-punch-through implantation region NW3 is formed above the shallow n-type implantation region NW2 by an additional ion implantation process.

In some embodiments, the deep n-type implantation region NW1 is formed by implanting phosphorous (P) or arsenic (As) at an acceleration energy in a range from about 70 keV to about 150 KeV, and in a range from about 80 keV to about 140 keV in other embodiments. The center of the deep n-type implantation region NW1 is located at about 100 nm to about 200 nm deep from the surface of the substrate 100. The dose amount for the deep n-type implantation region NW1 is in a range from about range from $2 \times 10^{13}$ ions·cm$^{-2}$ to about $8 \times 10^{13}$ ions·cm$^{-2}$ and is in a range from about range from $3 \times 10^{13}$ ions·cm$^{-2}$ to $6 \times 10^{13}$ ions·cm$^{-2}$ in other embodiments.

In some embodiments, the shallow n-type implantation region NW2 is formed by implanting phosphorous or arsenic at an acceleration energy in a range from about 40 keV to about 70 KeV, and in a range from about 30 keV to about 60 keV in other embodiments. The center of the shallow n-type implantation region NW2 is located at about 40 nm to about 90 nm deep from the surface of the substrate 100. The dose amount for the shallow n-type implantation region NW2 is in a range from about range from $2 \times 10^{13}$ ions·cm$^{-2}$ to about $8 \times 10^{13}$ ions·cm$^{-2}$ and is in a range from about range from $3 \times 10^{13}$ ions·cm$^{-2}$ to $6 \times 10^{13}$ ions·cm$^{-2}$ in other embodiments. In some embodiments, the dose amount for the shallow n-type implantation region NW2 is the same as or different from the dose amount for the deep n-type implantation region NW1.

In some embodiments, the anti-punch-through implantation region NW3 is formed by implanting phosphorous or arsenic at an acceleration energy in a range from about 3 keV to about 25 KeV, and in a range from about 5 keV to about 20 keV in other embodiments. The center of the anti-punch-through implantation region NW3 is located at about 8 nm to about 35 nm deep from the surface of the substrate 100. The dose amount for the anti-punch-through implantation region NW3 is in a range from about range from $2 \times 10^{13}$ ions·cm$^{-2}$ to about $2 \times 10^{14}$ ions·cm$^{-2}$ and is in a range from about range from $5 \times 10^{13}$ ions·cm$^{-2}$ to $1 \times 10^{14}$ ions·cm$^{-2}$ in other embodiments. In some embodiments, the dose amount for the anti-punch-through implantation region NW3 is larger than the dose amounts for the deep and shallow n-type implantation regions.

The ions for the implantations regions NW1, NW2 and/or NW3 are implanted along the normal direction of the substrate 100 in some embodiments, and in other embodiments, the implanting direction of the ions is tilted from the normal direction at about 7-8 degrees to avoid channeling effects. If the implanting direction is tilted, two or four implantation operations may be performed with rotating the substrate by 180 degrees or 90 degrees within its surface plane. As shown in FIG. 5, due to scattering by lattice of the substrate 100, the implanted regions extend below the second mask pattern 30. The deeper the implanted region is, the greater the amount of extension becomes.

Then, as shown in FIG. 6, carbon ions 35 are implanted into the substrate 100. In some embodiments, the same second mask pattern 30 is used for the carbon implantation. In some embodiments, the implantation direction of the carbon ions is tilted by $\theta 2$ degrees and $-\theta 2$ degrees with respect to the normal line NL of the substrate 100. In some embodiments, the tilt angle $\theta 2$ is in a range from about 5 degrees to about 18 degrees, and is in a range from about 7 degrees to about 15 degrees in other embodiments. In some embodiments, the tilt angle θ2 is equal to or greater than an angle θ0', which is an angle between the normal direction NL and line L2 shown in FIG. 6 and is defined by the width W2 of the mask opening and the thickness T2 of the second mask pattern 30. In some embodiments, the width W2 is in a range from about 50 nm to about 200 nm and the thickness T2 is in a range from about 400 nm to about 600 nm. As shown in FIG. 6, the second carbon implanted regions CB2 are formed below the edges of the second mask pattern 30. In some embodiments, θ2 is equal to or smaller than θ1.

In some embodiments, the second carbon implantation region CB2 is formed by implanting carbon at acceleration energy in a range from about 10 keV to about 60 KeV, and in a range from about 5 keV to about 50 keV in other embodiments. The center of the second carbon implantation region CB2 is located at about 45 nm to about 165 nm deep from the surface of the substrate 100. As shown in FIG. 4, in some embodiments, the second carbon implantation region CB2 is located between the deep and shallow n-type implantation regions NW1 and NW2. In some embodiments, the second carbon implantation region CB2 is formed deeper than the first carbon implantation region CB1. The dose amount for the second carbon implantation region CB2 is in a range from about range from $1 \times 10^{13}$ ions·cm$^{-2}$ to about $2 \times 10^{14}$ ions·cm$^{-2}$ and is in a range from about range from $3 \times 10^{13}$ ions·cm$^{-2}$ to $1 \times 10^{14}$ ions·cm$^{-2}$ in other embodiments. The carbon ion implantation can be performed before the implantation processes for the n-type implantation regions NW1-NW3, in some embodiments. The doping concentration of the carbon implantation region CB2 is in a range from about $1 \times 10^{18}$ atoms·cm$^{-3}$ to about $2 \times 10^{19}$ atoms·cm$^{-3}$ in some embodiments.

Figure 7:
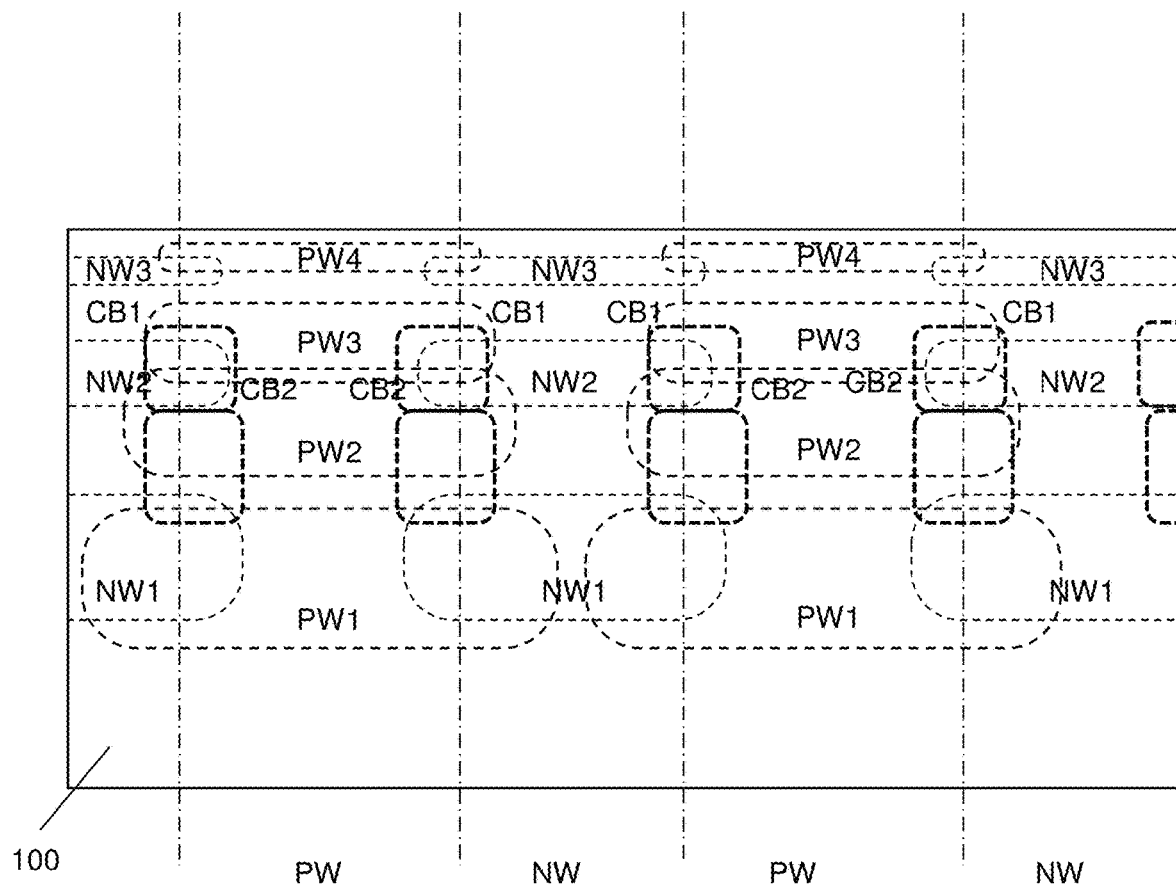
FIG. 7 illustrates one of the various stages of a semiconductor device fabrication process in accordance with an embodiment of the present disclosure.

Subsequently, the second mask pattern 30 is removed, as shown in FIG. 7.

In the foregoing embodiments, the p-type implantation regions PW1-PW4 and the first carbon implantation region CB1 are formed with the first mask pattern 20 and then the n-type implantation regions NW1-NW3 and the second carbon implantation region CB2 are formed with the second mask pattern 30. In other embodiments, the n-type implantation regions NW1-NW3 and the second carbon implantation region CB2 are formed with the second mask pattern 30 and then the p-type implantation regions PW1-PW4 and the first carbon implantation region CB1 are formed with the first mask pattern 20.

In certain embodiments, the first carbon implantation region CB1 is formed with the second mask pattern 30 and the second carbon implantation region CB2 are formed with the first mask pattern 20. Further, in some embodiments, the first carbon implantation region CB1 and the second carbon implantation region CB2 are formed by using the first mask pattern 20 prior to or subsequent to the ion implantation operations for the p-type implantation regions PW1-PW4. In other embodiments, the first carbon implantation region CB1 and the second carbon implantation region CB2 are formed by using the second mask pattern 30 prior to or subsequent to the ion implantation operations for the n-type implantation regions NW1-NW3.

Figure 8:
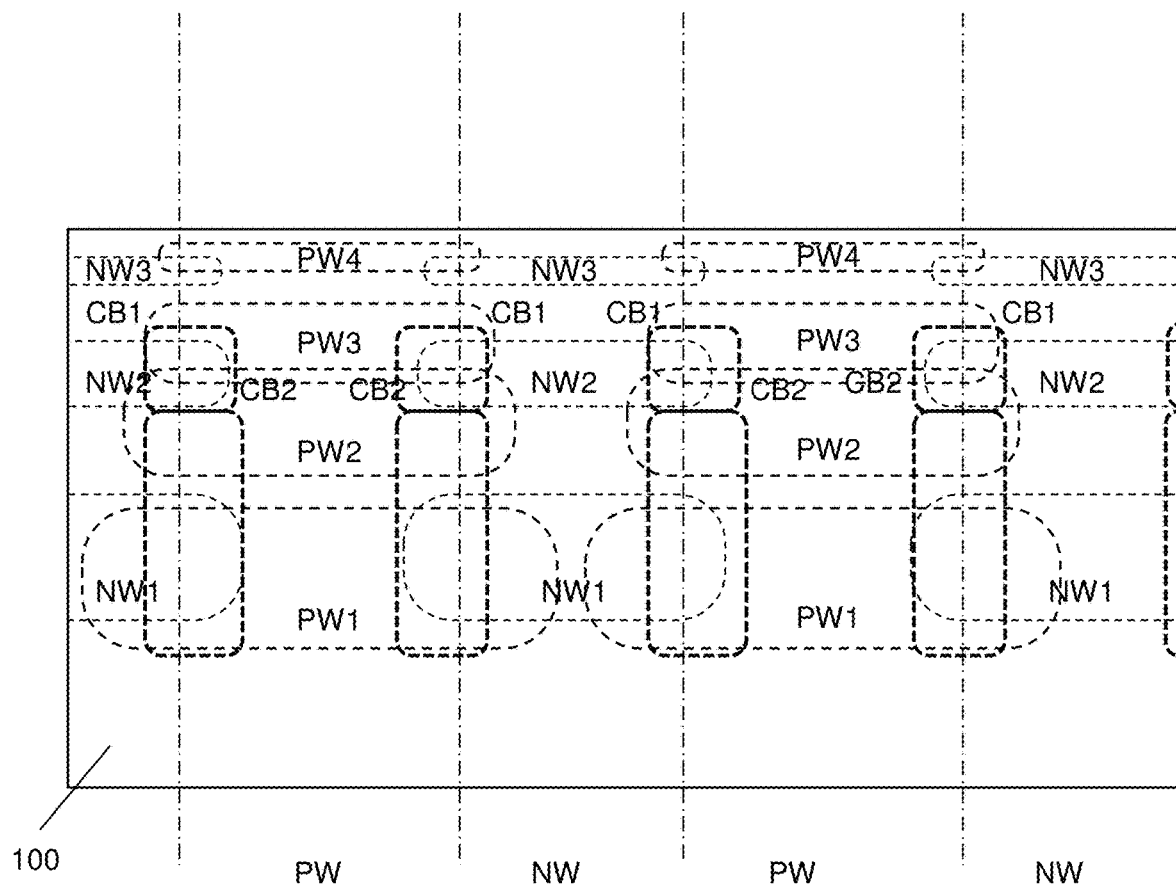
FIG. 8 illustrates one of the various stages of a semiconductor device fabrication process in accordance with an embodiment of the present disclosure.

Then, in some embodiments, a thermal process, for example, an anneal process, is performed to activate the implanted impurities and to recover damaged lattices by the implantation, as shown in FIG. 8. In certain embodiments, the thermal process is performed by using rapid thermal annealing (RTA) at a temperature in a range of about 900° C. to about 1050° C. for about 1.5 seconds to about 30 seconds in an inert gas ambient, such as an $N_2$, Ar or He ambient.

Figure 9:
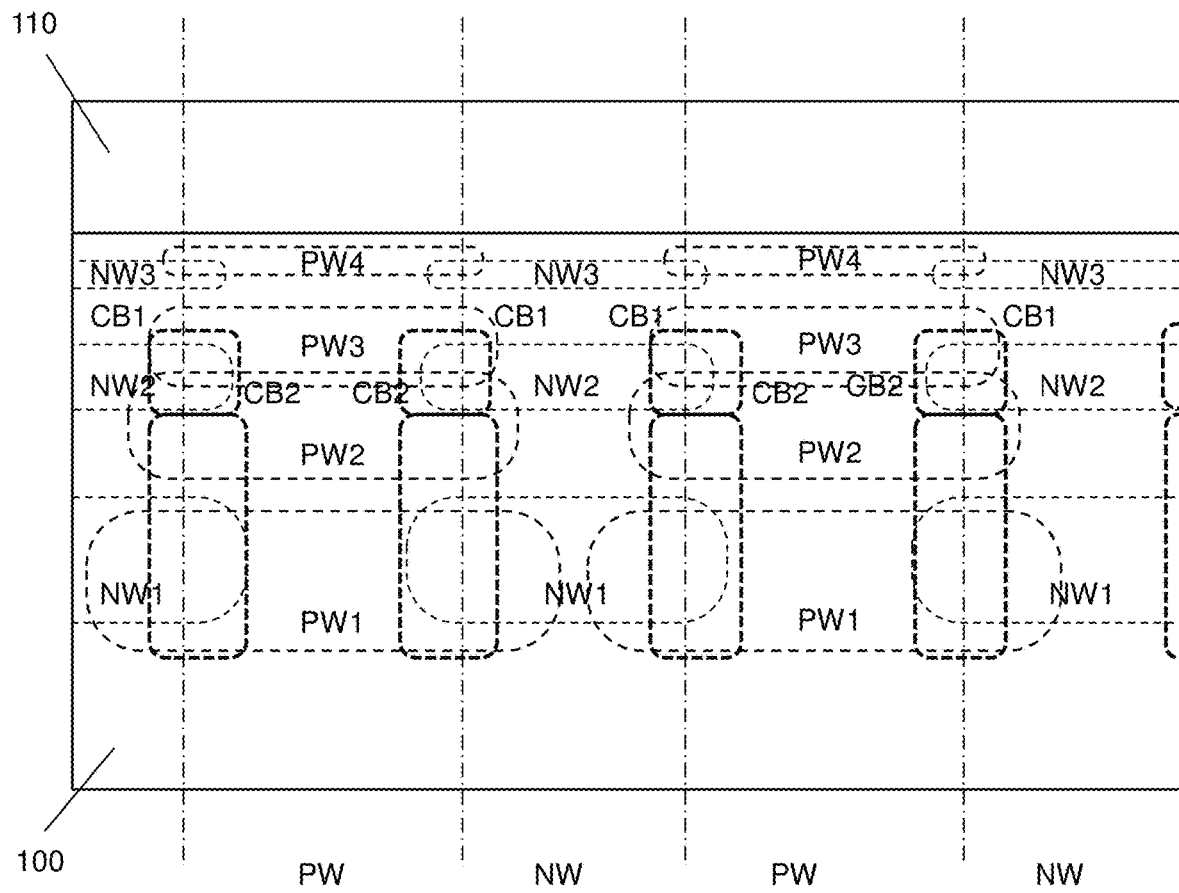
FIG. 9 illustrates one of the various stages of a semiconductor device fabrication process in accordance with an embodiment of the present disclosure.

Subsequently, as shown in FIG. 9, a semiconductor epitaxial layer 110 is formed over the substrate 100. In some embodiments, the epitaxial layer 110 is the same semiconductor material as the substrate 100, for example, silicon. In other embodiments, the epitaxial layer 110 includes semiconductor material different from the substrate 100. In certain embodiments, the epitaxial layer 110 is made of Group-IV compound semiconductors (silicon germanium (SiGe), silicon carbide (SiC), silicon germanium carbide (SiGeC), GeSn, SiSn, SiGeSn), Group III-V compound semiconductors (e.g., gallium arsenide (GaAs), indium gallium arsenide (InGaAs), indium arsenide (InAs), indium phosphide (InP), indium antimonide (InSb), gallium arsenic phosphide (GaAsP), or gallium indium phosphide (GaInP)). In some embodiments, one or more epitaxial layers are formed over the substrate 100. A thickness of the epitaxial layer 110 is in a range from about 100 nm to about 500 nm in some embodiments. The epitaxial layer may be formed through one or more processes such as chemical vapor deposition (CVD), molecular beam epitaxy (MBE) and/or atomic layer deposition (ALD), although any acceptable process may be utilized.

Figure 10:
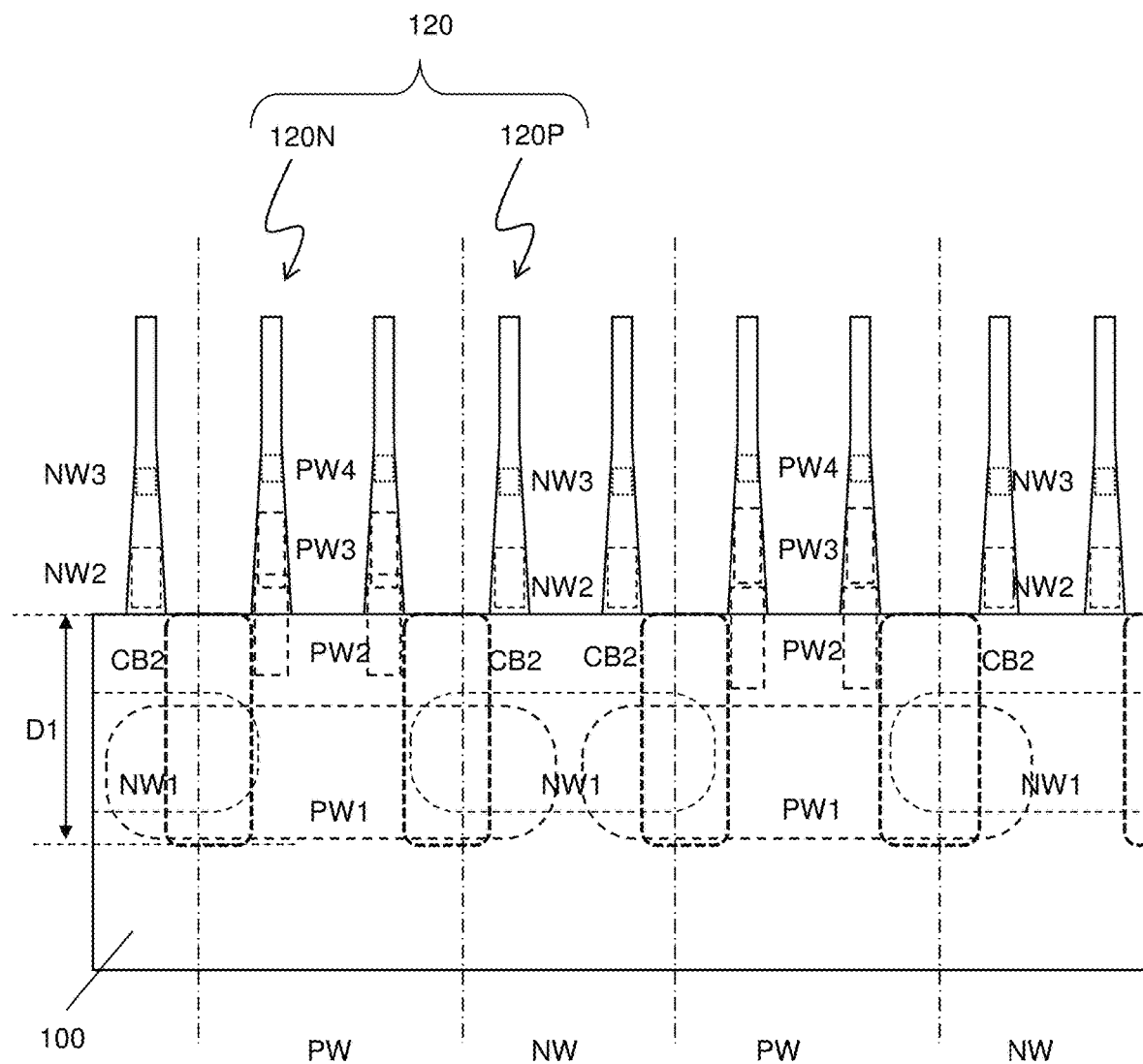
FIG. 10 illustrates one of the various stages of a semiconductor device fabrication process in accordance with an embodiment of the present disclosure.

Then, as shown in FIG. 10, one or more fin structures 120P for p-type FETs and one or more fin structures 120N for n-type FETs are formed using, for example, a patterning process. The fin structures 120 may be patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fin structures. In some embodiments, one or more dummy fin structures are formed adjacent to the fin structure 120 of an active FinFET.

By the etching for forming the fin structures 120, the epitaxial layer 110 and the upper region of the substrate 100 are partially removed. In some embodiments, the etching of the substrate 100 reaches the depth at which the middle p-type implantation region PW2 is located, and passes through the shallow p-type implantation region PW3 and the shallow n-type implantation region NW2. In such a case, the fin structure 120N for n-type FETs includes a part of the anti-punch-through implantation region PW4, a part of the shallow p-type implantation region PW3 and a part of the middle p-type implantation region PW2, as shown in FIG. 10. Similarly, the fin structure 120P for p-type FETs includes a part of the anti-punch-through implantation region NW3 and a part of the shallow n-type implantation region NW2, as shown in FIG. 10. In some embodiments, the first carbon implantation region CB1 is not included in the fin structure 120, and in other embodiments, the first carbon implantation region CB1 is included at the bottom of the fin structure 120, in particular, a tapered bottom portion of the fin structure 120. The shallow p-type implantation region PW3 and a part of the middle p-type implantation region PW2 form a p-type well in the fin structure, and the part of the middle p-type implantation region PW2 and the deep p-type implantation region PW1 form a p-type well in the substrate. The shallow n-type implantation region NW2 forms an n-type well in the fin structure, and the deep n-type implantation region NW1 form an n-type well in the substrate.

Further, as shown in FIG. 10, the second carbon implantation regions CB2 are located at boundaries of the p-well regions PW and the n-well regions NW. A part of the second carbon implantation region CB2 overlaps with the deep p-type implantation region PW1 and the deep n-type implantation region NW1, and thus, both carbon and phosphorous (and/or arsenic) can be detected at the overlapped region, for example, by secondary ion mass spectroscopy.

Figure 11:
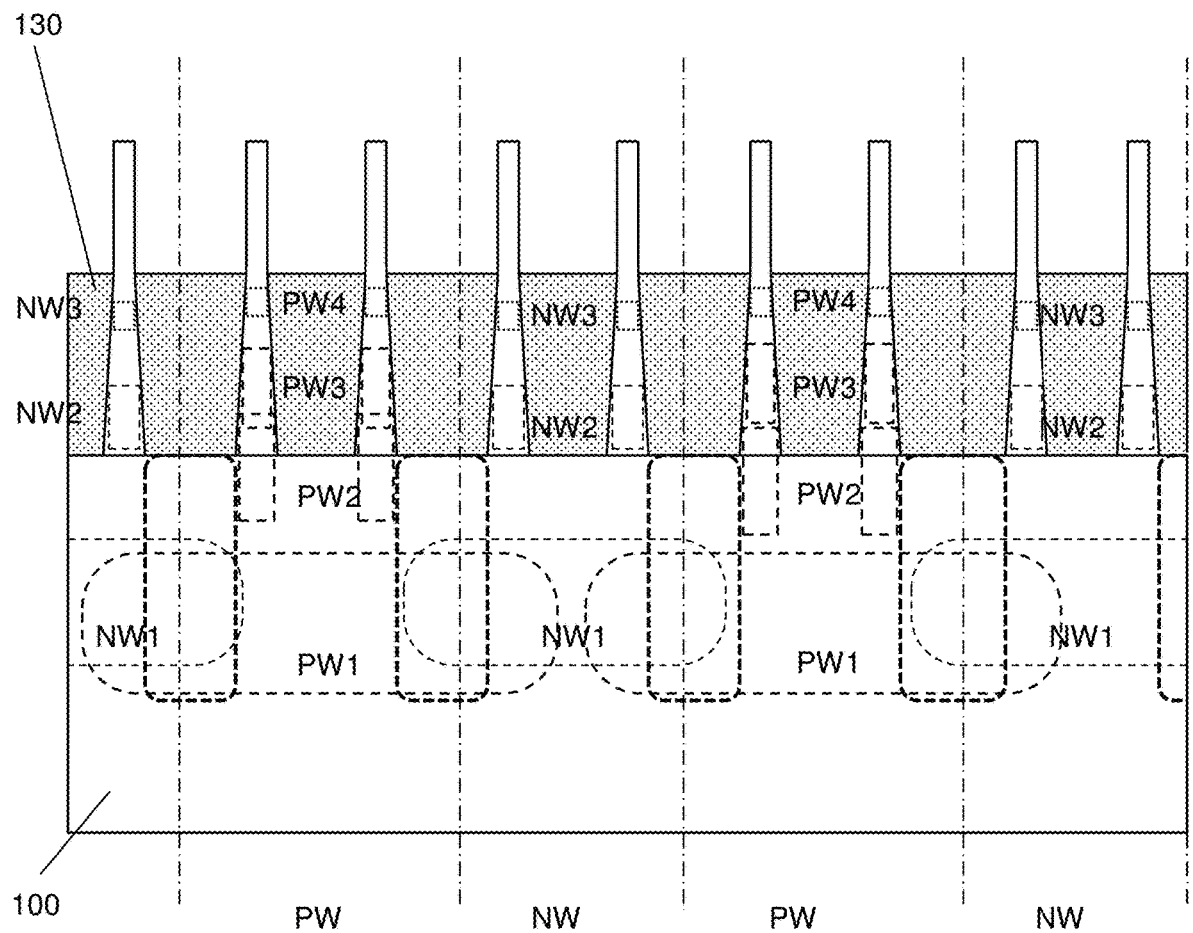
FIG. 11 illustrates one of the various stages of a semiconductor device fabrication process in accordance with an embodiment of the present disclosure.

After the fin structures 120 are formed, an isolation insulating layer 130 (e.g., shallow trench isolation (STI)), is disposed over the fin structures 120 and the substrate 100, as shown in FIG. 11. Prior to forming the isolation insulating region 130, one or more liner layers are formed over the substrate 100 and sidewalls of the bottom part of the fin structures 120, in some embodiments. In some embodiments, the liner layers include a first fin liner layer formed on the substrate 100 and sidewalls of the bottom part of the fin structures 120, and a second fin liner layer formed on the first fin liner layer. Each of the liner layers has a thickness between about 1 nm and about 20 nm in some embodiments. In some embodiments, the first fin liner layer includes silicon oxide and has a thickness between about 0.5 nm and about 5 nm, and the second fin liner layer includes silicon nitride and has a thickness between about 0.5 nm and about 5 nm. The liner layers may be deposited through one or more processes such as physical vapor deposition (PVD), chemical vapor deposition (CVD), or atomic layer deposition (ALD), although any acceptable process may be utilized.

The isolation insulating layer 130 includes one or more layers of insulating materials, for example, silicon dioxide, silicon oxynitride and/or silicon nitride formed by LPCVD (low pressure chemical vapor deposition), plasma-CVD or flowable CVD. In the flowable CVD, flowable dielectric materials instead of silicon oxide are deposited. Flowable dielectric materials, as their name suggest, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydro-polysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove un-desired element(s) to form silicon oxide. When the un-desired element(s) is removed, the flowable film densifies and shrinks. In some embodiments, multiple anneal processes are conducted. The flowable film is cured and annealed more than once. The flowable film may be doped with boron and/or phosphorous. The isolation insulating layer 130 may be formed by one or more layers of SOG, SiO, SiON, SiOCN or fluorine-doped silicate glass (FSG) in some embodiments.

After forming the isolation insulating layer 130 over the fin structures 120, a planarization operation is performed so as to remove part of the isolation insulating layer 130 and a mask layer (e.g., a pad oxide layer and a silicon nitride mask layer) which is used to pattern the fin structures. The planarization operation may include a chemical mechanical polishing (CMP) and/or an etch-back process. Subsequently, portions of the isolation insulating layer 130 extending over the top surfaces of the fin structures 120, and portions of the liner layers over the top surfaces of the fin structures 120 are removed using, for example, an etch process, chemical mechanical polishing (CMP), or the like. Further, the isolation insulating layer 130 is recessed to expose the upper portion of the fin structures 120. In some embodiments, the isolation insulating layer 130 is recessed using a single etch processes, or multiple etch processes. In some embodiments in which the isolation insulating layer 130 is made of silicon oxide, the etch process may be, for example, a dry etch, a chemical etch, or a wet cleaning process. In certain embodiments, the partially removing the isolation insulating layer 130 may be performed using a wet etching process, for example, by dipping the substrate in hydrofluoric acid (HF). In another embodiment, the partially removing the isolation insulating layer 130 may be performed using a dry etching process. For example, a dry etching process using $CHF_3$ or $BF_3$ as etching gases may be used.

After forming the isolation insulating layer 130, a thermal process, for example, an anneal process, may be performed to improve the quality of the isolation insulating layer 130. In certain embodiments, the thermal process is performed by using rapid thermal annealing (RTA) at a temperature in a range of about 900° C. to about 1050° C. for about 1.5 seconds to about 10 seconds in an inert gas ambient, such as an $N_2$, Ar or He ambient.

Figure 12:
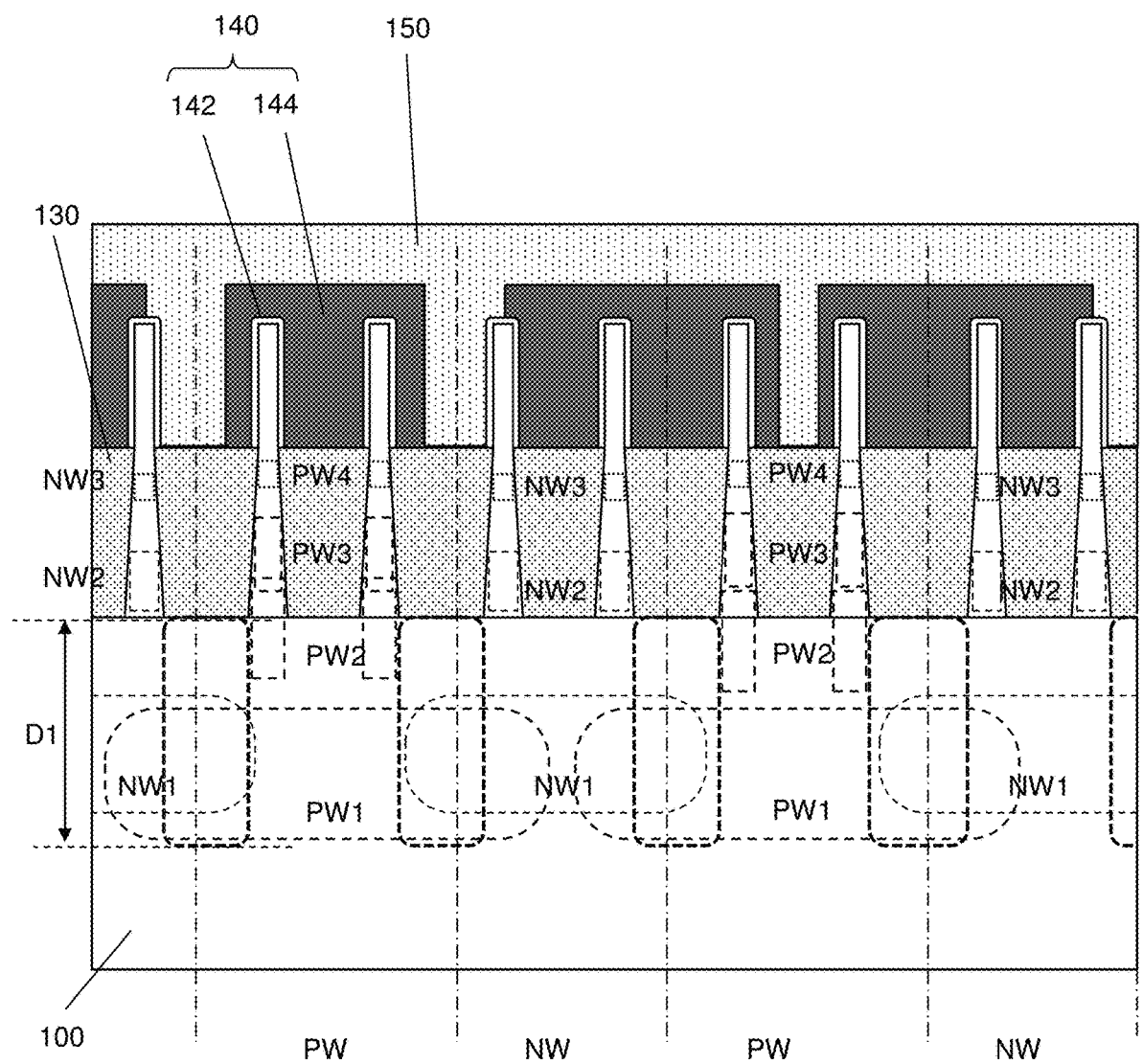
FIG. 12 illustrates one of the various stages of a semiconductor device fabrication process in accordance with an embodiment of the present disclosure.

After the fin structures 120 and the isolation insulating layer 130 are formed, a gate structure 140 and one or more interlayer dielectric layers 150 are formed, as shown in FIG. 12. In some embodiments, a gate dielectric layer 142 and a poly silicon gate electrode 144 are formed over an upper protruding portion of the fin structure 120.

In other embodiments, a metal gate structure using a gate replacement technology is employed. In the gate replacement technology, a dummy gate structure including a dummy gate dielectric layer and a dummy gate electrode layer are formed over the exposed fin structures 120. The dummy gate dielectric layer and the dummy gate electrode layer will be subsequently used to define and form the source/drain regions. By one or more patterning operations, a dummy gate structure disposed part of the fin structure is formed.

Further, sidewall spacers are formed on opposing sidewalls of the dummy gate structure. The sidewall spacers include one or more dielectric layers. In one embodiment, the sidewall spacers are made of one or more of silicon oxide, silicon nitride, SiOCN, SiCN, aluminum oxide, AlCO or AlCN, or any other suitable dielectric material.

Subsequently, one or more source/drain epitaxial layers are formed on the fin structures. After the source/drain epitaxial layer is formed, one or more interlayer dielectric (ILD) layers are formed. In some embodiments, before forming the ILD layer, an etch stop layer (ESL) is formed over the source/drain epitaxial layer and sidewall spacers. After the ILD layer is formed, a planarization operation, such as an etch-back process and/or a chemical mechanical polishing (CMP) process, is performed to expose the upper surface of the dummy gate electrode layer.

Then, the dummy gate electrode layer is removed, thereby forming a gate space. After the upper portion of the fin structures 120 are exposed, in the gate space, a gate dielectric layer 142 including an interfacial layer and a high-k gate dielectric layer are formed on the exposed fin structures (channel layers) 120. The interfacial layer is a chemically formed silicon oxide in some embodiments. The high-k gate dielectric layer includes one or more layers of HfO$_2$, HfSiO, HfSiON, HfTaO, HfTiO, HfZrO, zirconium oxide, aluminum oxide, titanium oxide, hafnium dioxide-alumina (HfO$_2$—Al$_2$O$_3$) alloy, other suitable high-k dielectric materials.

In addition, one or more conductive layers 144 are formed over the gate dielectric layer 142. The conductive layer 144 may include a barrier layer formed by one or more layers of TaN, TiN, TiN doped with Si, or any other suitable conductive material. The conductive layers 144 further include one or more work function adjustment layers. The work function adjustment layer is made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FinFET, one or more of TaN, TaAlC, TiN, TiC, Co, TiAl, HfTi, TiSi and TaSi is used as the work function adjustment layer, and for the p-channel FinFET, one or more of TiAlC, Al, TiAl, TaN, TaAlC, TiN, TiC and Co is used as the work function adjustment layer.

The conductive layer 144 includes a main metal layer including a metallic material selected from the group consisting of W, Cu, Ti, Ag, Al, TiAl, TiAlN, TaC, TaCN, TaSiN, Mn, Co, Pd, Ni, Re, Jr, Ru, Pt, and Zr.

As shown in FIGS. 10 and 12, the depth D1 from the bottom of the isolation insulating region 130 to the bottom of the carbon barrier is in a range from about 50 nm to about 100 nm in some embodiments.

After forming the gate electrodes 140, further CMOS processes are performed to form various features such as additional interlayer dielectric layers, contacts/vias, interconnect metal layers, and passivation layers, etc. The foregoing multi angle ion implantation operations can be applied to both n-type FinFETs and p-type FinFETs.

Figure 13:
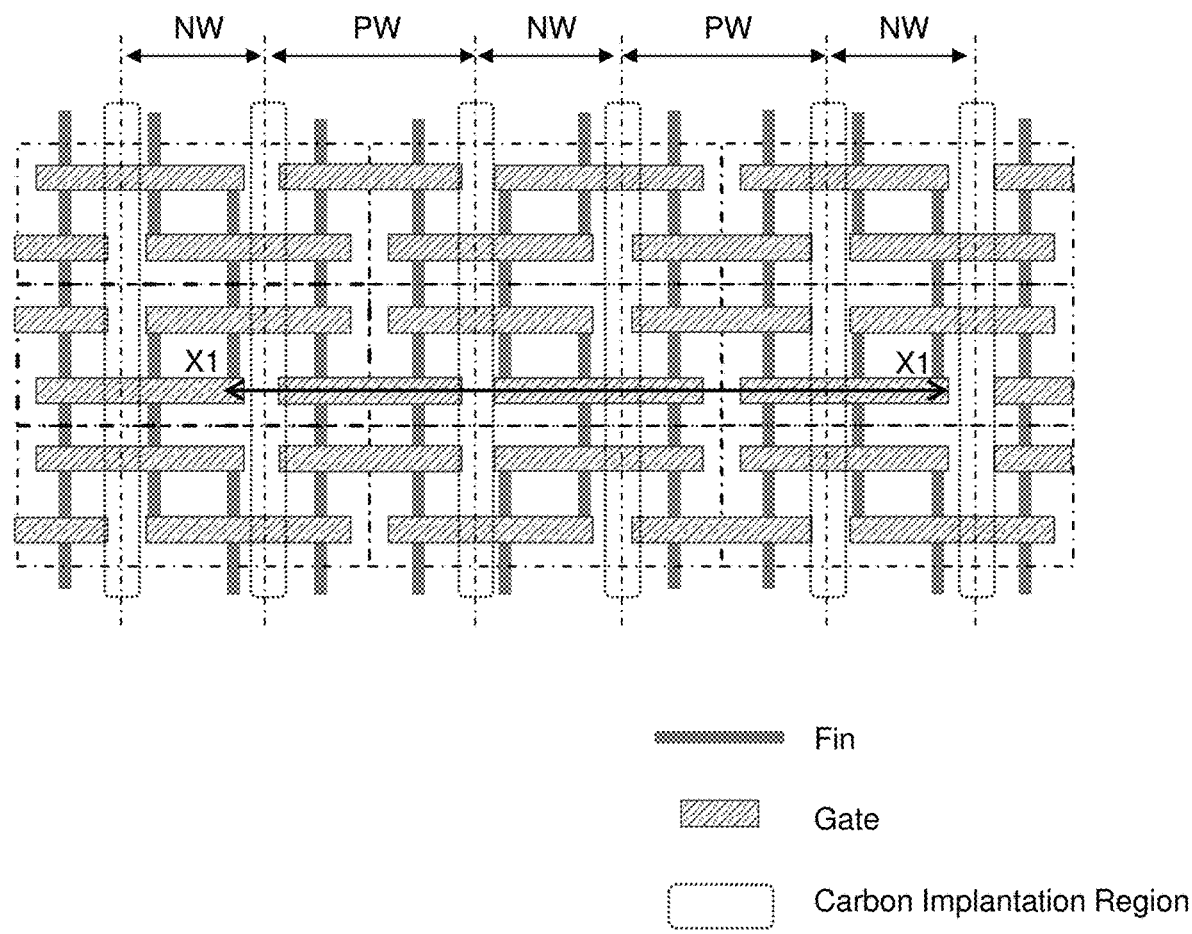
FIG. 13 illustrates a plan view of a static random access memory in accordance with an embodiment of the present disclosure.

FIG. 13 shows a plan view of an SRAM cells in accordance with an embodiment of the present disclosure. As shown in FIG. 13, the n-type well region NW and p-type well region PW are repeatedly arranged in the X direction. On and around the boundaries of the n-type well region NW and p-type well region PW, carbon barrier regions (carbon implantation regions) are disposed.

Figure 14:
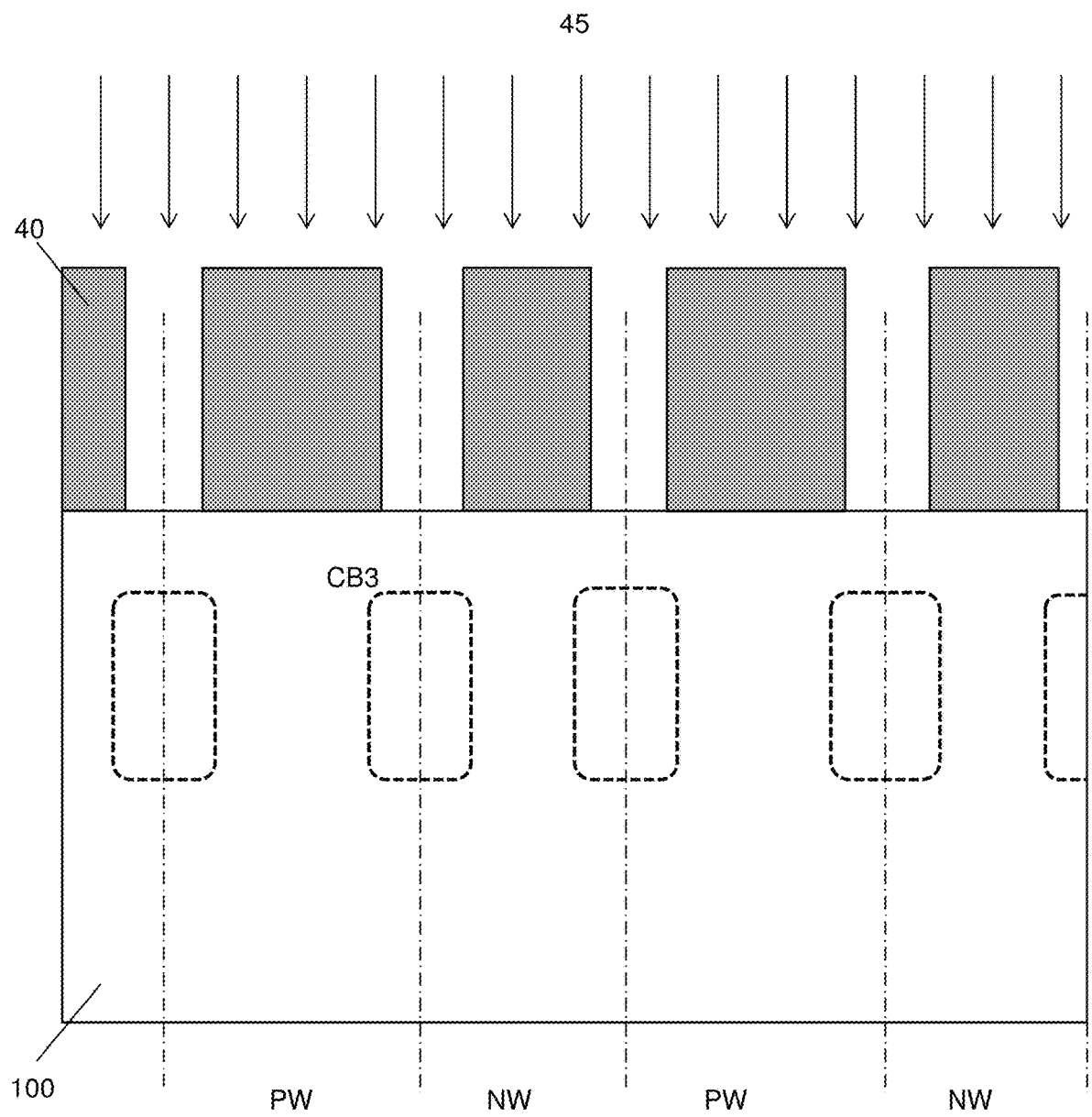
FIG. 14 illustrates one of the various stages of a semiconductor device fabrication process in accordance with another embodiment of the present disclosure.

FIG. 14 shows a cross sectional view one of the manufacturing operations of a semiconductor device in accordance with another embodiment of the present disclosure. Materials, configurations, dimensions, structures, conditions and operations the same as or similar to those explained with respect to FIGS. 1-13 may be employed in the following embodiments, and some of the explanations may be omitted.

In the foregoing embodiments, the first and second mask patterns 20, 30 for p-type and n-type implantation regions are also used to form the carbon implantation regions. In this embodiment, a third mask pattern 40 is used to form the carbon implantation regions, as shown in FIG. 14. As shown in FIG. 14, the third mask pattern 40, for example a photo resist pattern, is formed over the substrate 100. The third mask pattern 40 includes openings above the boundaries between the n-type well regions NW and p-type well regions PW. Then, one or more carbon implantation 45 is performed to form a carbon implantation region CB3. In this embodiment, the tilt angle is about 0 degrees with respect to the normal direction of the substrate 100.

Figure 15:
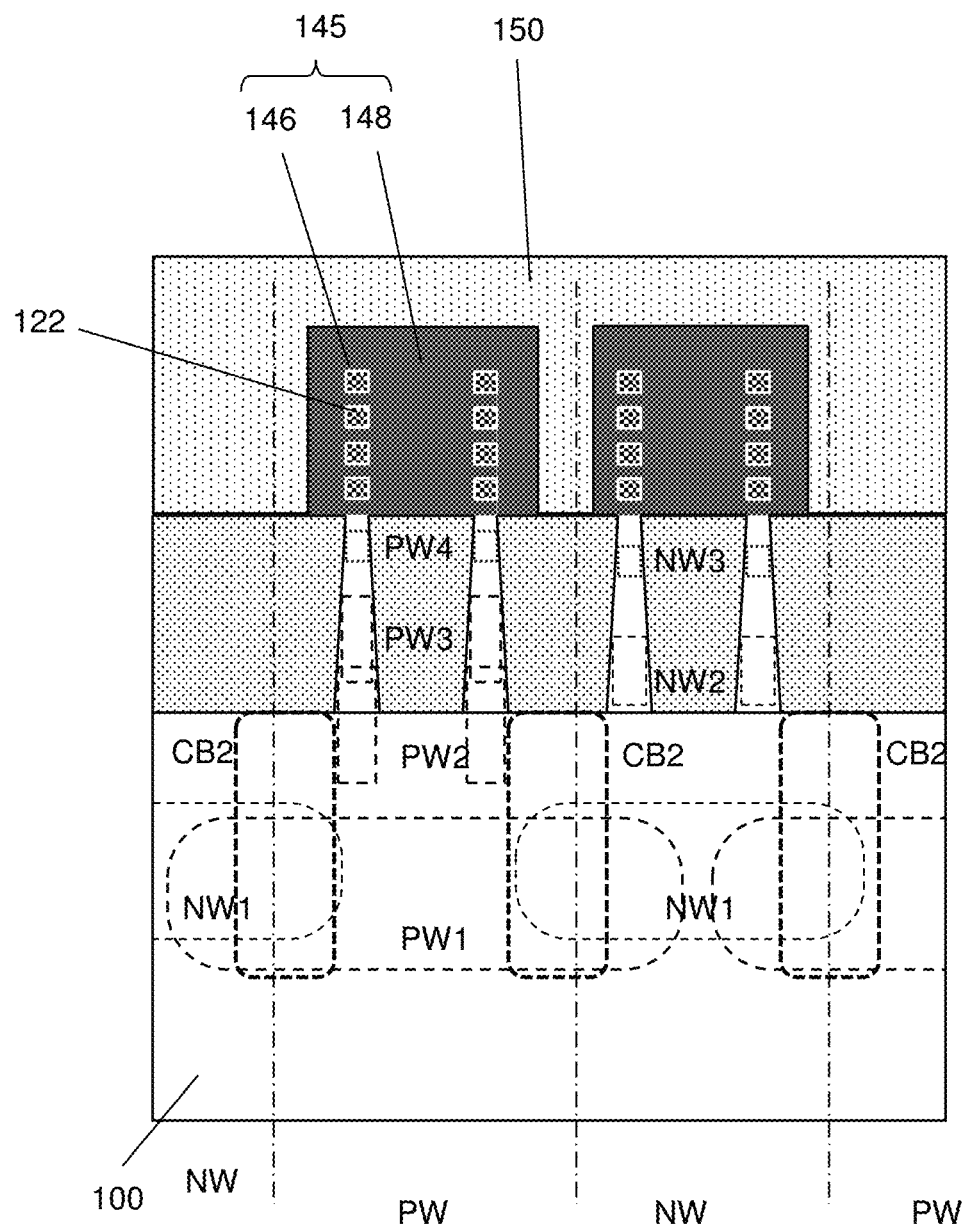
FIG. 15 illustrates a cross sectional view of a semiconductor device in accordance with another embodiment of the present disclosure.

FIG. 15 shows a cross sectional view one of the manufacturing operations of a semiconductor device in accordance with another embodiment of the present disclosure. Materials, configurations, dimensions, structures, conditions and operations the same as or similar to those explained with respect to FIGS. 1-14 may be employed in the following embodiments, and some of the explanations may be omitted.

In FIG. 15, gate-all-around (GAA) FETs using semiconductor nano-wires are provided. As shown in FIG. 15, one or more semiconductor nano-wires 122 are disposed over fin structures at least including the anti-punch-through regions PW4 or NW3, and the shallow implantation regions PW3 or NW2. The nano-wires 122 are wrapped around by a high-k dielectric layer 146 at the channel region and the metal gate 148 are formed over the high-k dielectric layer 146. The well structures and bottom-fin structures are substantially the same as those in FIGS. 10-12. Similar to FIGS. 10-12, the second carbon implantation regions CB2 are located at boundaries of the p-well regions PW and the n-well regions NW. A part of the second carbon implantation region CB2 overlaps with the deep p-type implantation region PW1 and the deep n-type implantation region NW1, and thus, both carbon and phosphorous (and/or arsenic) can be detected at the overlapped region, for example, by secondary ion mass spectroscopy.

By using one or more carbon barrier regions, it is possible to more effectively electrically separate a p-type well and an n-type well, and thus to prevent latch up in a CMOS device. Further, by using the same mask patterns as those for well formation in the carbon implantation, it is possible to suppress an increase in manufacturing cost.

It will be understood that not all advantages have been necessarily discussed herein, no particular advantage is required for all embodiments or examples, and other embodiments or examples may offer different advantages.

In accordance with an aspect of the present disclosure, in a method for manufacturing a semiconductor device, a first-conductivity type implantation region is formed in a semiconductor substrate, and a carbon implantation region is formed at a side boundary region of the first-conductivity type implantation region. In one or more of the foregoing and following embodiments, the carbon implantation region includes an upper carbon implantation region and a lower carbon implantation region disposed below the upper carbon implantation region. In one or more of the foregoing and following embodiments, a doping concentration of carbon in the upper carbon implantation region is different from a doping concentration of the lower carbon implantation region. In one or more of the foregoing and following embodiments, the first-conductivity type implantation region is formed by one or more first impurity ion implantation processes using a first mask pattern having an opening, and the carbon implantation region is formed by one or more carbon ion implantation processes using the first mask pattern. In one or more of the foregoing and following embodiments, an implantation angle of the one or more carbon ion implantation processes with respect to a normal direction of the substrate is different from an implantation angle of the one or more first impurity ion implantation processes. In one or more of the foregoing and following embodiments, the implantation angle of the one or more carbon ion implantation processes with respect to the normal direction of the substrate is 7 degrees to 15 degrees. In one or more of the foregoing and following embodiments, the first-conductivity type implantation region is formed by one or more first impurity ion implantation processes using a first mask pattern having a first opening, and the carbon implantation region is formed by one or more carbon ion implantation processes using a second mask pattern having a second opening at a location different from the first opening.

In accordance with another aspect of the present disclosure, in a method of manufacturing a semiconductor device, a p-type implantation region is formed in a semiconductor substrate. An n-type implantation region is formed in the semiconductor substrate. A carbon implantation region is formed at a boundary region between the p-type implantation region and the n-type implantation region. In one or more of the foregoing and following embodiments, the carbon implantation region is formed by one or more carbon ion implantation processes having different acceleration energies. In one or more of the foregoing and following embodiments, the p-type implantation region is formed by one or more first impurity ion implantation processes having different acceleration energies. In one or more of the foregoing and following embodiments, the one or more first impurity ion implantation processes utilizes a first mask pattern having an opening, and the carbon implantation region is formed by one or more carbon ion implantation processes using the first mask pattern. In one or more of the foregoing and following embodiments, an implantation angle of the one or more carbon ion implantation processes with respect to a normal direction of the substrate is different from an implantation angle of the one or more first impurity ion implantation processes. In one or more of the foregoing and following embodiments, the implantation angle of the one or more carbon ion implantation processes with respect to the normal direction of the substrate is 7 degrees to 15 degrees. In one or more of the foregoing and following embodiments, the n-type implantation region is formed by one or more second impurity ion implantation processes having different acceleration energies. In one or more of the foregoing and following embodiments, the one or more second impurity ion implantation processes utilizes a second mask pattern having an opening, and the carbon implantation region is formed by one or more carbon ion implantation processes using the second mask pattern. In one or more of the foregoing and following embodiments, an implantation angle of the one or more carbon ion implantation processes with respect to a normal direction of the substrate is different from an implantation angle of the one or more second impurity ion implantation processes. In one or more of the foregoing and following embodiments, the implantation angle of the one or more carbon ion implantation processes with respect to the normal direction of the substrate is 7 degrees to 15 degrees.

In accordance with another aspect of the present disclosure, in a method of manufacturing a semiconductor device, p-type implantation regions are formed in a semiconductor substrate. N-type implantation regions are formed in the semiconductor substrate. Carbon implantation regions are formed at a boundary region between the p-type implantation regions and the n-type implantation regions. In one or more of the foregoing and following embodiments, the carbon implantation regions are formed by a first carbon ion implantation process and a second carbon ion implantation process, the p-type implantation regions are formed by first impurity implantation processes having different acceleration energies and using a first mask having a first opening, and the n-type implantation regions are formed by second impurity implantation processes having different acceleration energies and using a second mask having a second opening of which location is different from the first opening. The first and second carbon implantation processes performed are one of (i) using the first mask for the first carbon ion implantation process and using the second mask for the second carbon ion implantation process, (ii) using the first mask for the first carbon ion implantation process and the second carbon ion implantation process, or (iii) using the second mask for the first carbon ion implantation process and the second carbon ion implantation process. In one or more of the foregoing and following embodiments, implantation angles of the first and second carbon ion implantation processes with respect to a normal direction of the substrate are 7 degrees to 15 degrees.

In accordance with one aspect of the present disclosure, a semiconductor device includes a semiconductor substrate, a first-conductivity type well region in the semiconductor substrate, and a carbon implantation region at a side boundary region of the first-conductivity type well region. In one or more of the foregoing and following embodiments, the carbon implantation region includes an upper carbon implantation region and a lower carbon implantation region disposed below the upper carbon implantation region. In one or more of the foregoing and following embodiments, a doping concentration of carbon in the upper carbon implantation region is different from a doping concentration of the lower carbon implantation region. In one or more of the foregoing and following embodiments, a doping concentration of the carbon implantation region is in a range from $1\times10^{18}$ atoms·cm$^{-3}$ to $2\times10^{19}$ atoms·cm$^{-3}$. In one or more of the foregoing and following embodiments, the first-conductivity type well region includes a lower well region, a middle well region disposed over the lower well region and an upper well region disposed over the middle well region, and the carbon implantation region is disposed at a side boundary region of the lower well region. In one or more of the foregoing and following embodiments, a field effect transistor is disposed over the first-conductivity type well region.

In accordance with another aspect of the present disclosure, a semiconductor device includes a semiconductor substrate, a p-type well region in the semiconductor substrate, an n-type well region in the semiconductor substrate, and a carbon implantation region at a boundary region between the p-type well region and the n-type well region. In one or more of the foregoing and following embodiments, a doping concentration of the carbon implantation region is in a range from $1\times10^{18}$ atoms·cm$^{-3}$ to $2\times10^{19}$ atoms·cm$^{-3}$. In one or more of the foregoing and following embodiments, the p-type well region includes a lower p-well region, a middle p-well region disposed over the lower p-well region and an upper p-well region disposed over the middle p-well region, the n-type well includes a lower n-well region and an upper n-well region disposed over the lower n-well region, and the carbon implantation region is disposed at a boundary region of the lower p-well region and the lower n-well region. In one or more of the foregoing and following embodiments, a dopant concentration of the middle p-well region is smaller than a dopant concentration of the upper p-well region and a dopant concentration of the lower p-well region. In one or more of the foregoing and following embodiments, the semiconductor device further includes a p-type anti-punch-through region disposed over the p-type well region, and an n-type anti-punch-through region disposed over the n-type well region. In one or more of the foregoing and following embodiments, a first field effect transistor (FET) is disposed over the p-type anti-punch-through region and a second FET is disposed over the n-type anti-punch-through region. In one or more of the foregoing and following embodiments, the carbon barrier region overlaps the p-type well region and the n-type well region.

In accordance with another aspect of the present disclosure, a semiconductor device includes a static random access memory (SRAM). The SRAM includes an n-channel fin field effect transistor (FinFET) having a first fin structure disposed over a semiconductor substrate, a p-channel Fin-FET having a second fin structure disposed over the substrate, a p-type well formed in the semiconductor substrate, a n-type well formed in the semiconductor substrate, and a carbon barrier region disposed at a boundary region between the p-type well and the n-type well. In one or more of the foregoing and following embodiments, a first p-type implantation region is formed in the first fin structure, and a first n-type implantation region is formed in the second fin structure. In one or more of the foregoing and following embodiments, a second p-type implantation region is formed between the p-type well and the first p-type implantation region. In one or more of the foregoing and following embodiments, a p-type anti-punch-through region is formed in the first fin structure over the first p-type implantation region, and an n-type anti-punch-through region is formed in the second fin structure over the first n-type implantation region. In one or more of the foregoing and following embodiments, a dopant concentration of the second p-type implantation region is smaller than a dopant concentration of the first p-type implantation region and a dopant concentration of the p-type well. In one or more of the foregoing and following embodiments, a lower part of the second p-type implantation region is located in the semiconductor substrate, and an upper part of the second p-type implantation region is located in the first fin structure. In one or more of the foregoing and following embodiments, the carbon barrier region overlaps the p-type well and the n-type well.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a semiconductor substrate;
   a first fin structure protruding from a first surface of the semiconductor substrate;
   a second fin structure protruding from the first surface of the semiconductor substrate;
   a first conductivity type implantation region formed in the substrate,
   wherein the first conductivity type implantation region comprises a first implantation region and a second implantation region at different depths in the substrate; and
   a carbon barrier region disposed at a region of the semiconductor substrate between the first fin structure and the second fin structure,
   wherein the carbon barrier region extends from the first surface of the semiconductor substrate and overlaps the first implantation region and the second implantation region.

2. The semiconductor device of claim 1, further comprising:
   a second conductivity type implantation region in the semiconductor substrate below the second fin structure,
   wherein the carbon barrier region is disposed at a boundary region between the first conductivity type implantation region and the second conductivity type implantation region.

3. The semiconductor device of claim 2, wherein a doping concentration of the carbon barrier region is in a range from $1\times10^{18}$ cm$^{-3}$ to $2\times10^{19}$ cm$^{-3}$.

4. The semiconductor device of claim 1, wherein the first implantation region is disposed at a greater depth in the substrate than the second implantation region.

5. The semiconductor device of claim 4, wherein a dopant concentration of the second implantation region is less than a dopant concentration of the first implantation region.

6. The semiconductor device of claim 1, further comprising:
   an anti-punch-through region disposed at the first fin structure and the second fin structure.

7. The semiconductor device of claim 6, wherein a first field effect transistor (FET) is disposed over the anti-punch-through region disposed at the first fin structure and a second FET is disposed over the anti-punch-through region disposed at the second fin structure.

8. The semiconductor device of claim 1, wherein a depth D1 from the first surface of the semiconductor substrate to a bottom of the carbon barrier region is in a range from 50 nm to 100 nm.

9. A semiconductor device comprising:
   a semiconductor substrate;
   a first fin structure protruding from a first surface of the semiconductor substrate;
   a second fin structure protruding from the first surface of the semiconductor substrate;
   a first conductivity type implantation region formed in the substrate extending along a first direction,
   a second conductivity type implantation region formed in the substrate extending along the first direction,
   wherein an end portion of the first conductivity type implantation region overlaps an end portion of the second conductivity type implantation region along the first direction; and
   a carbon barrier region disposed at a region of the semiconductor substrate between the first fin structure and the second fin structure,
   wherein the carbon barrier region extends from the first surface of the semiconductor substrate and overlaps the first conductivity type implantation region and the second conductivity type implantation region.

10. The semiconductor device of claim 9, wherein a depth D1 from the first surface of the semiconductor substrate to a bottom of the carbon barrier region is in a range from 50 nm to 100 nm.

11. The semiconductor device of claim 9, wherein the first conductivity type implantation region includes a lower region and an upper region disposed over the lower region.

12. The semiconductor device of claim 11, wherein, the carbon barrier region is disposed at a boundary region of the lower region and the upper region.

13. The semiconductor device of claim 12, wherein a dopant concentration of the upper region is smaller than a dopant concentration of the lower region.

14. The semiconductor device of claim 9, further comprising:
   a first anti-punch-through region disposed at each of the first and second fin structures; and
   a second anti-punch-through region disposed at each of the first and second fin structures.

15. A semiconductor device comprising:
   a semiconductor substrate;
   a first fin structure protruding from a first surface of the semiconductor substrate;

a second fin structure protruding from the first surface of the semiconductor substrate;

a first conductivity type implantation region formed in the substrate;

a second conductivity type implantation region formed in the substrate; and a carbon barrier region disposed at a region of the semiconductor substrate between the first fin structure and the second fin structure, wherein a bottom of each of the first and second fin structures includes carbon in an amount of $1 \times 10^{18}$ atoms·cm$^{-3}$ to $2 \times 10^{19}$ atoms·cm$^{-3}$, and the carbon barrier region extends from the first surface of the semiconductor substrate and overlaps the first conductivity type implantation region and the second conductivity type implantation region.

16. The semiconductor device of claim 15, wherein a depth D1 from the first surface of the semiconductor substrate to a bottom of the carbon barrier region is in a range from 50 nm to 100 nm.

17. The semiconductor device of claim 15, wherein the first conductivity type implantation region includes a lower region and an upper region disposed over the lower region.

18. The semiconductor device of claim 17, wherein, the carbon barrier region is disposed at a boundary region of the lower region and the upper region.

19. The semiconductor device of claim 17, wherein a dopant concentration of the upper region is smaller than a dopant concentration of the lower region.

20. The semiconductor device of claim 15, further comprising:

an anti-punch-through region disposed at the first fin structure and the second fin structure.

* * * * *